United States Patent
Dunn

(10) Patent No.: US 8,208,115 B2
(45) Date of Patent: Jun. 26, 2012

(54) FLUID COOLED DISPLAY

(75) Inventor: William Dunn, Alpharetta, OH (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 785 days.

(21) Appl. No.: 12/191,834

(22) Filed: Aug. 14, 2008

(65) Prior Publication Data

US 2009/0129021 A1    May 21, 2009

Related U.S. Application Data

(63) Continuation-in-part of application No. 11/941,728, filed on Nov. 16, 2007, now Pat. No. 8,004,648.

(60) Provisional application No. 61/033,058, filed on Mar. 3, 2008, provisional application No. 61/033,064, filed on Mar. 3, 2008, provisional application No. 61/053,717, filed on May 16, 2008, provisional application No. 61/057,599, filed on May 30, 2008.

(51) Int. Cl.
*G02F 1/1333* (2006.01)
*H05K 7/20* (2006.01)

(52) U.S. Cl. ........................ 349/161; 361/699

(58) Field of Classification Search .................. 349/161; 361/687, 691, 699; 165/80.4, 104.33, 121, 165/287; 62/56
See application file for complete search history.

(56) References Cited

U.S. PATENT DOCUMENTS

| | | | | |
|---|---|---|---|---|
| 4,748,765 | A * | 6/1988 | Martin ............................. | 43/55 |
| 4,952,783 | A * | 8/1990 | Aufderheide et al. ......... | 219/528 |
| 2003/0128511 | A1 * | 7/2003 | Nagashima et al. .......... | 361/687 |
| 2006/0125998 | A1 * | 6/2006 | Dewa et al. .................... | 349/161 |
| 2006/0132699 | A1 | 6/2006 | Cho et al. | |
| 2006/0209266 | A1 | 9/2006 | Utsunomiya | |
| 2006/0274237 | A1 * | 12/2006 | Nelson et al. ................. | 349/112 |
| 2007/0030879 | A1 * | 2/2007 | Hatta ............................. | 373/94 |
| 2007/0151664 | A1 | 7/2007 | Shin | |

FOREIGN PATENT DOCUMENTS

| | | |
|---|---|---|
| EP | 1762892 | 3/2007 |
| JP | 02-062015 | * 3/1990 |
| JP | 02-307080 | * 12/1990 |

* cited by examiner

*Primary Examiner* — Dung Nguyen
*Assistant Examiner* — Tai Duong
(74) *Attorney, Agent, or Firm* — Standley Law Group LLP

(57) ABSTRACT

Preferred embodiments relates to a cooling system and a method for cooling an electronic display. Embodiments include a transparent liquid cooling chamber, a reservoir tank, and a pump. The components in the system are preferably housed within the electronic display housing. The cooling chamber defines a fluid compartment that is anterior to and coextensive with the electronic display surface. Circulating coolant removes heat directly from the electronic display surface by advection. In order to view the display, the coolant fluid is transparent or at least semi-transparent. The image quality of an exemplary embodiment remains essentially unchanged, even though coolant is flowing over the visible face of the electronic display surface.

23 Claims, 5 Drawing Sheets

FLUID COOLED DISPLAY

CROSS-REFERENCE TO RELATED APPLICATIONS

This application is a non-provisional patent application and claims priority to co-pending application Nos. 61/033,058 filed Mar. 3, 2008; 61/033,064 filed Mar. 3, 2008; 61/054,717 filed May 16, 2009; and 61/057,599 filed May 30, 2008, which are herein incorporated in their entirety. This application is a Continuation-in-part of U.S. application Ser. No. 11/941,728 filed Nov. 16, 2007, which is herein incorporated in its entirety.

TECHNICAL FIELD

This invention generally relates to cooling systems and in particular to cooling systems for electronic displays.

BACKGROUND OF THE ART

Conductive and convective heat transfer systems for electronic displays are known. These systems of the past generally attempt to remove heat from the electronic components in a display through as many sidewalls of the display as possible. In order to do this, the systems of the past have relied primarily on fans for moving air past the components to be cooled and out of the display. In some cases, the heated air is moved into convectively thermal communication with fins. Some of the past systems also utilize conductive heat transfer from heat producing components directly to heat conductive housings for the electronics. In these cases, the housings have a large surface area, which is in convective communication with ambient air outside the housings. Thus, heat is transferred convectively or conductively to the housing and is then transferred into the ambient air from the housing by natural convection.

While such heat transfer systems have enjoyed a measure of success in the past, improvements to displays require even greater cooling capabilities.

SUMMARY OF THE INVENTION

In particular, cooling devices for electronic displays of the past have generally used convective heat dissipation systems that function to cool an entire interior of the display by one or more fans and fins, for example. By itself, this is not adequate in many climates, especially when radiative heat transfer from the sun through a display window becomes a major factor. In many applications and locations 200 Watts or more of power through such a display window is common. Furthermore, the market is demanding larger screen sizes for displays. With increased electronic display screen size and corresponding display window size more heat will be generated and more heat will be transmitted into the displays.

In the past, many displays have functioned satisfactorily with ten or twelve inch screens. Now, many displays are in need of screens having sizes greater than or equal to twenty-four inches that may require improved cooling systems. For example, some outdoor applications call for sixty inch screens and above. With increased heat production with the larger screens and radiative heat transfer from the sun through the display window, heat dissipation systems of the past, which attempt to cool the entire interior of the display with fins and fans, are no longer adequate.

A large fluctuation in temperature is common in the devices of the past. Such temperature fluctuation adversely affects the electronic components in these devices. Whereas the systems of the past attempted to remove heat only through the non-display sides and rear components of the enclosure surrounding the electronic display components, a preferred embodiment of the present invention causes advective heat transfer from the face of the display as well. By the aspects described below, the present invention has made consistent cooling possible for electronic displays having screens of sizes greater than or equal to twelve inches. For example, cooling of a 55 inch screen can be achieved, even in extremely hot climates. Greater cooling capabilities are provided by the device and method described and shown in more detail below.

A preferred embodiment of the present invention relates to a cooling system and a method for cooling an electronic display. A preferred embodiment includes a transparent liquid cooling chamber, a reservoir tank, and a pump. The components in the system are preferably housed within the electronic display housing. The cooling chamber defines a fluid compartment that is anterior to and coextensive with the electronic display surface. The pump causes coolant fluid to move through the cooling chamber. The reservoir tank provides the system with a constant supply of coolant and also provides surface area to conduct heat away from the coolant fluid contained therein. The circulating coolant removes heat directly from the electronic display surface by advection. In order to view the display, the coolant fluid is transparent or at least semi-transparent. The image quality of an exemplary embodiment remains essentially unchanged, even though coolant is flowing over the visible face of the electronic display surface.

In certain embodiments, the system may also include a filter. The filter may be included to remove contaminants that collect in the coolant fluid. Additionally, the system may also be provided with a radiator. The addition of a radiator may further assist in radiating heat contained in the liquid coolant. If included, the filter and the radiator may be in fluid communication with the cooling chamber, the reservoir tank, and the pump.

Optionally, a fan unit may also be included within the housing of the display if further cooling capability is desired. The fan unit may be positioned to provide a near laminar flow of air within the interior of the housing. Thus, excessive heat in the housing interior may be transferred outside of the housing.

Provided a fan is included, the display and system may further include an optional air curtain device to reduce the amount of heat on the surface of the display. The air curtain system redirects exhaust air generated by the fan so that it passes over the face of the display to provide a supplemental cooling mechanism.

The display and system may include sensors. The display and system may also be a first display and system of a plurality of displays with respective systems. Alternatively, the present invention may include a plurality of electronic displays and respective cooling systems.

In a preferred method, the system is supplied with a predetermined amount of coolant fluid. The coolant fluid is then pumped through the interconnected components of the cooling system. As the fluid moves through the system, heat is transferred away from the electronic display surface. Preferably, the reservoir tank provides an occasion for the returned coolant fluid to cool before the fluid is re-circulated through the cooling chamber.

The foregoing and other features and advantages of the present invention will be apparent from the following more detailed description of the particular embodiments of the invention, as illustrated in the accompanying drawings.

BRIEF DESCRIPTION OF THE DRAWINGS

A better understanding of an exemplary embodiment will be obtained from a reading of the following detailed description and the accompanying drawings wherein identical reference characters refer to identical parts and in which.

DETAILED DESCRIPTION OF A PREFERRED EMBODIMENT

Embodiments of the present invention relate to a cooling system for an electronic display and to combinations of the cooling system and the electronic display.

Figure 1:
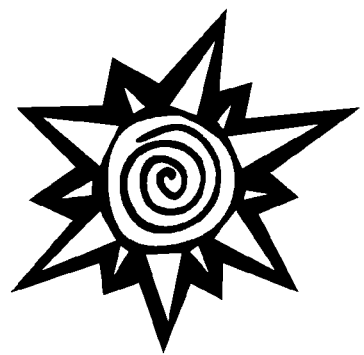
FIG. 1 is a perspective view of an exemplary embodiment in conjunction with an exemplary electronic display.
Figure 1:
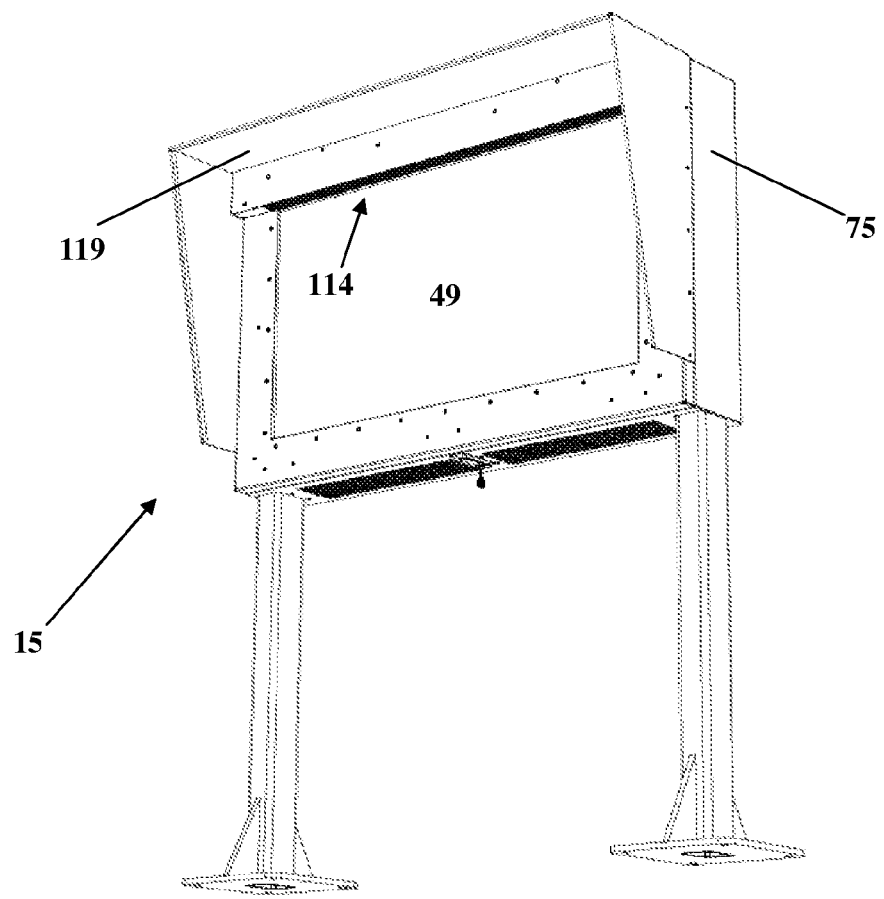

FIG. 1 shows an exemplary embodiment of the present invention. As may be appreciated, when the display 15 is exposed to outdoor elements, the temperatures inside the display 15 will vary greatly without some kind of cooling device. As such, the electronics including the display screen (e.g., LCD screen) will have a greatly reduced life span. By implementing certain embodiments of the cooling system disclosed herein, temperature fluctuation is greatly reduced. This cooling capability has been achieved in spite of the fact that larger screens generate more heat than smaller screens.

Because the display 15 has an innovative cooling system, it may be placed in direct sunlight. Although the cooling system may be used on smaller displays, it is especially useful for larger LCD, LED, or organic light emitting diodes (OLED) displays. These screens, especially with displays over 24 inches, face significant cooling issues in outdoor environments.

Figure 2:
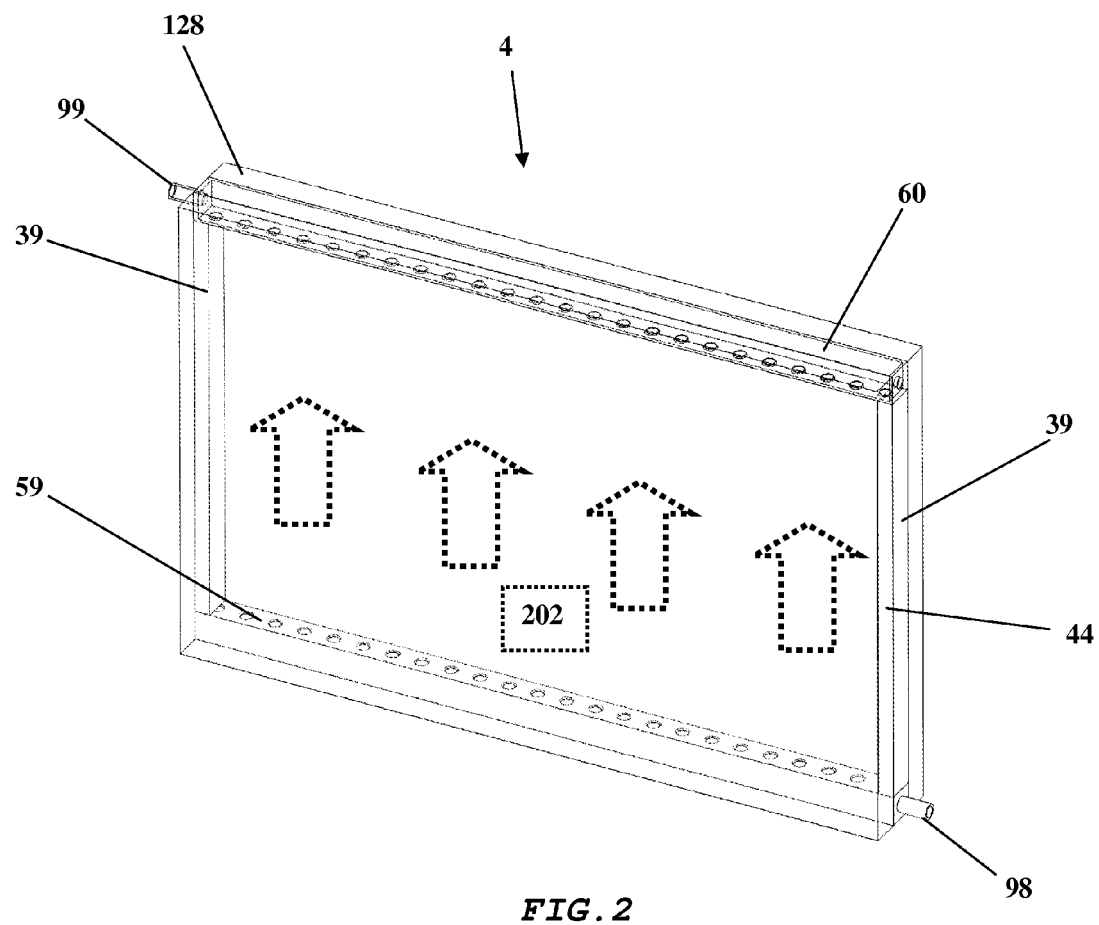
FIG. 2 is a perspective view of an exemplary embodiment of the cooling chamber.
Figure 3:
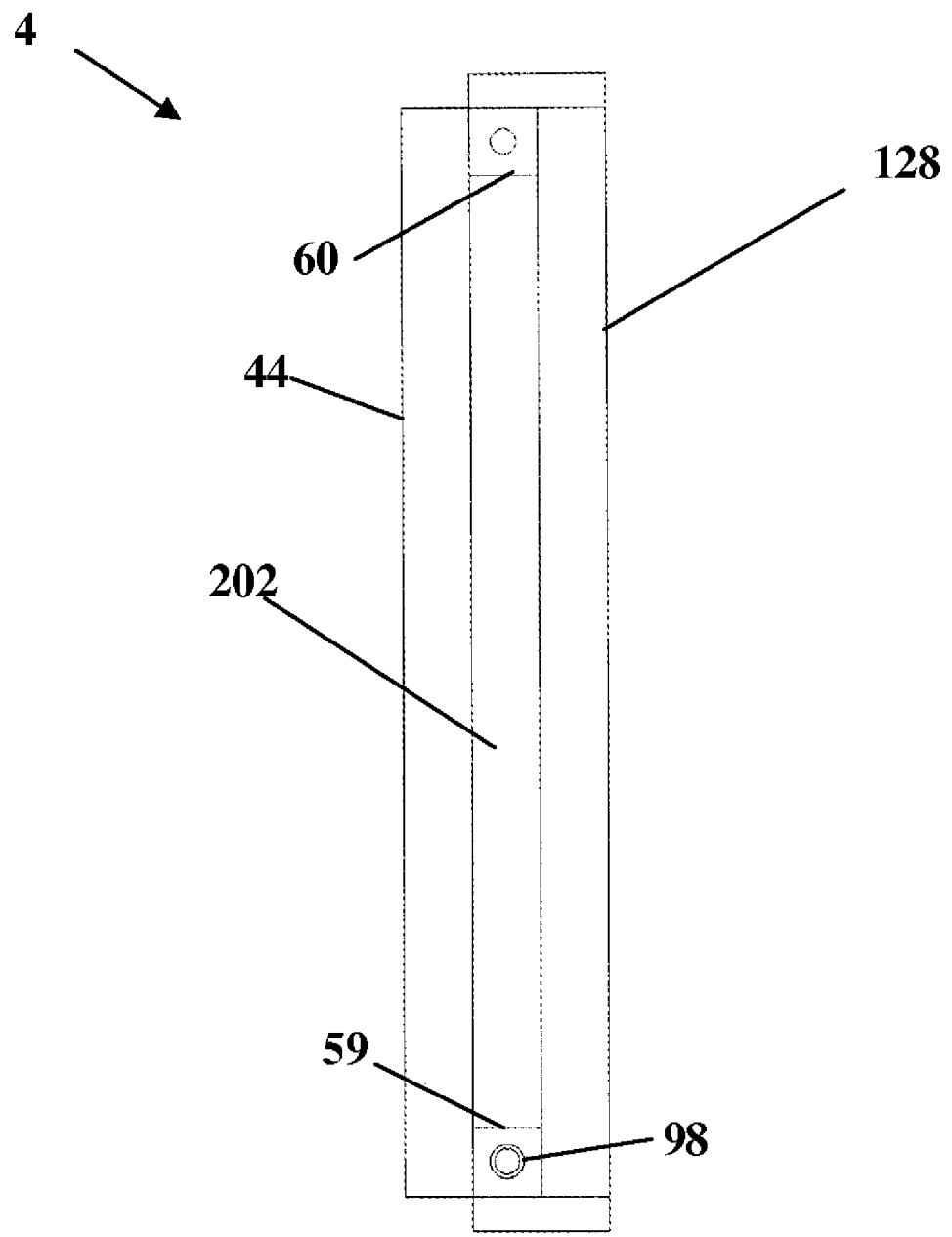
FIG. 3 is a side view of an exemplary embodiment of the cooling chamber.

In FIG. 1, the display area 49 of electronic display 15 is completely covered by a transparent fluid coolant contained within a narrow fluid compartment that is anterior to and coextensive with the electronic display surface (see 128 in FIGS. 2 and 3). The display shown also is equipped with an optional air curtain device 114 which is the subject matter of co-pending U.S. application Ser. No. 11/941,728, incorporated by reference herein. Optionally, the display also has a reflection shield 119, to mitigate reflection of the sunlight on the display surface. Additionally, in outdoor environments where sun exposure is an issue, housing 75 is preferably white or cream in color. A color which is light reflective will help to reduce the solar radiation absorbed by the housing 75.

It is to be understood that the spirit and scope of the disclosed embodiments includes cooling of displays including, but not limited to LCDs. By way of example and not by way of limitation, the present invention may be used in conjunction with displays selected from among LCD (including TFT or STN type), light emitting diode (LED), organic light emitting diode (OLED), field emitting display (FED), cathode ray tube (CRT), and plasma displays. Furthermore, embodiments of the present invention may be used with displays of other types including those not yet discovered. In particular, it is contemplated that the present invention may be well suited for use with full color, flat panel OLED displays. While the embodiments described herein are well suited for outdoor environments, they may also be appropriate for indoor applications (e.g., factory environments) where thermal stability of the display may be at risk.

In a preferred embodiment, the fluid used to cool the display is non-flammable. An exemplary coolant fluid includes 30% isopropyl alcohol, 20% distilled water, and 50% ethylene glycol. Preferably, the coolant fluid is resistant to freezing and will also inhibit the growth of harmful microorganisms. However, depending on the environmental conditions, many transparent fluids may be substituted with acceptable results.

Using a non-flammable liquid to cool the display has some important advantages. One advantage is that doing so permits the present invention to be used in applications that have restrictions on the use of flammable materials. For example, flammable liquid cooling systems would typically not be approved for gasoline display pumps because of the obvious fire hazards associated with that environment. However, it should be recognized that any number of transparent or semi-transparent fluids may be used, including flammable fluids, if the environment so permits.

As shown in FIG. 2 a significant feature of a preferred embodiment is the cooling chamber 4. The cooling chamber 4 comprises the electronic display surface 128 (e.g., the anterior surface of an LCD stack), a front glass 44 mounted in front of the electronic display surface, the entrance manifold 59, the exit manifold 60, and the spacing members 39. The spacing members 39 extend vertically along the side edges of the cooling chamber 4. In this way the spacers form interior sidewalls of the fluid compartment 202 and prevent coolant from leaving the chamber. Together, the entrance manifold 59, the exit manifold 60, and the spacing members 39 define the fluid compartment 202. The thickness of the fluid compartment 202 corresponds to the thickness of spacers 39 and the manifolds 59, 60. The thickness of the fluid compartment 202 may be adjusted as required for the particular application.

Although fluid coolant may conceivably move in either direction within the cooling system 22, it is preferable to pull the fluid in from the bottom through manifold 59 of the cooling chamber 4. Preferably, the fluid exits the cooling chamber 4 through exhaust manifold 60. While filling the chamber, it is best to fill the chamber from the bottom-up to inhibit air pocket formation which may negatively affect the display image. Filling the chamber 4 from the bottom up allows trapped air to efficiently evacuate the fluid compartment 202 through outlet 99.

During operation of the cooling system 22, a pump (not shown) causes the fluid to move through an inlet 98 at the entrance of manifold 59. Preferably, manifold 59 extends along the base of the narrow cooling chamber 4. The entrance manifold 59 includes a plurality of apertures from which the fluid coolant enters the fluid compartment 202. The presence of the entrance manifold 59 causes a uniform flow of coolant to enter and flow through the chamber 4. This helps to reduce the presence of air bubbles and flow disturbances that may negatively affect the display picture.

Preferably, the transparent coolant fluid is pulled upwards across the viewable face of the electronic display surface 128 (see the dash arrows). As the fluid travels across the display, the liquid conducts heat away from the surface of the display. The fluid exits the display through an exhaust manifold 60 which extends along the upper edge of the cooling chamber. The exhaust manifold 60 also includes a plurality of apertures from which the fluid coolant exits the fluid compartment 202. Preferably, the apertures along exhaust manifold 60 are smaller than the apertures along entrance manifold 59. This relationship helps to prevent curvature of plates 44, 128 caused by fluid pressures on the glass. Curvatures in these plates may negatively distort the display image.

The fluid coolant exits the exhaust manifold 60 through an outlet 99. Preferably the fluid, which has absorbed heat from the display, travels to the reservoir tank 37 where it is received into the return port 14 of the reservoir tank 37. As it moves across the electronic display surface 128, the coolant fluid may extract heat from the electronic display surface 128. By contacting the cooling fluid directly to the electronic display surface 128, maximal heat transfer will be achieved.

As shown in FIG. 3, the cooling chamber requires only one additional front glass 44. Advantageously, the preferred embodiments of the present invention utilize the electronic display surface 128 as the posterior surface of the cooling chamber 4. Therefore, in this context, the term "electronic display surface" means the front surface of a typical electronic display (in the absence of the embodiments disclosed herein). The electronic display surface 128 of typical displays is glass; however, neither plate 44 nor plate 128 need necessarily be glass. By utilizing the electronic display surface 128 as the posterior surface wall of the fluid compartment 202, there may be fewer surfaces to impact the visible light traveling through the display. Furthermore, the entire device will be lighter and cheaper to manufacturer.

Although the embodiment shown utilizes the electronic display surface 128, certain modifications and/or coatings (e.g., index matching dielectrics) may be added to the electronic display surface 128, or to other components of the system in order to accommodate the fluid coolant or to improve the optical performance of the device. In the embodiment shown, the electronic display surface 128 may be the front glass plate of a liquid crystal display stack. However, almost any display surface may be suitable for embodiments of the present cooling system.

Figure 4:
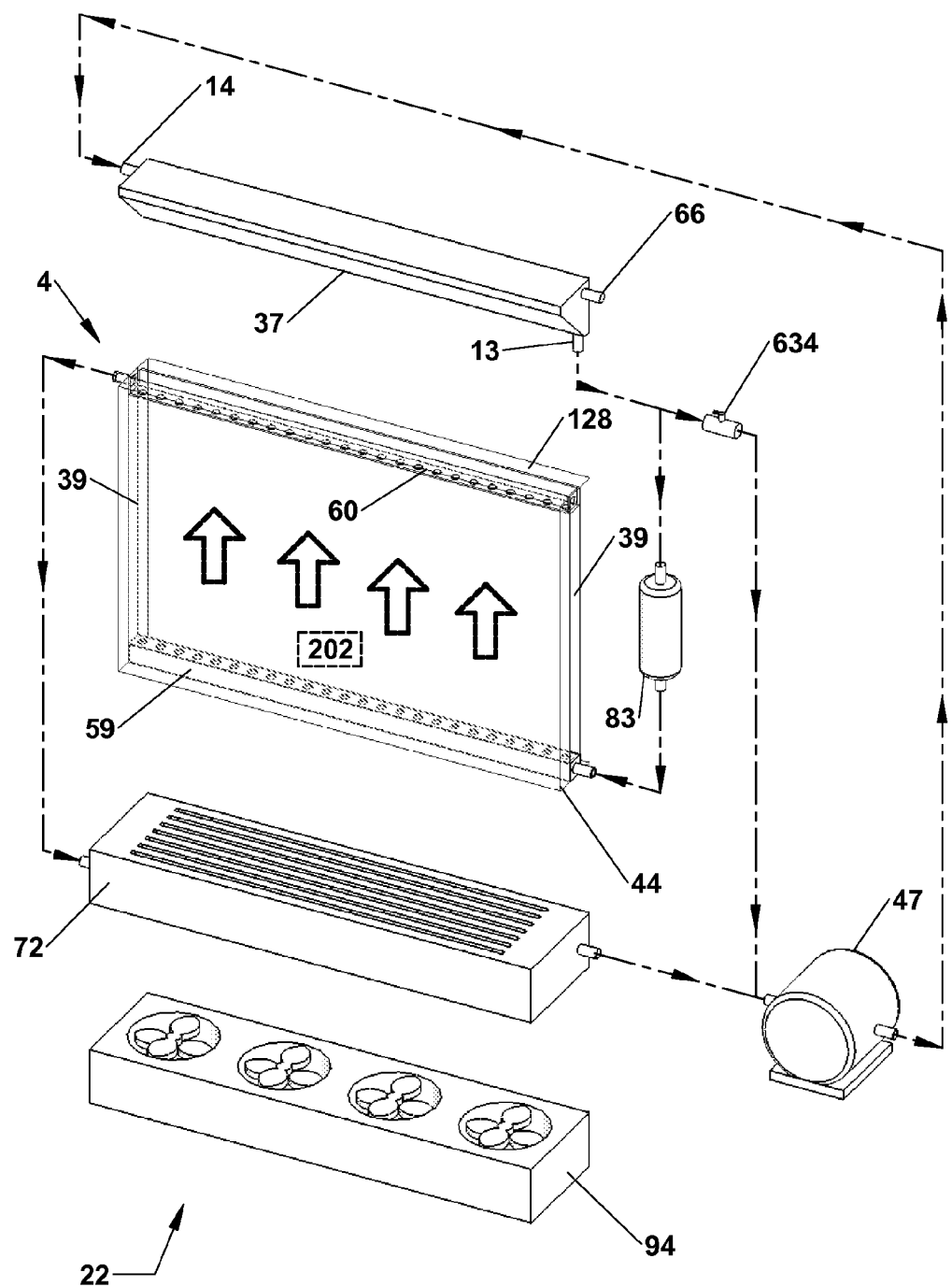
FIG. 4 is an explanatory schematic showing various components that may be included in a preferred embodiment.

FIG. 4 is an explanatory schematic illustrating an exemplary cooling system embodiment. As may be appreciated from the drawing, the cooling system 22 includes various components in fluid communication. Preferably, this may be accomplished by connecting the components with a series of tubes or pipes (illustrated conceptually as dotted lines in FIG. 4). The cooling system 22 components include a reservoir tank 37, a pump 47, and a cooling chamber 4 in fluid communication. Preferably, the system also includes a filter 83 and a radiator 72, also in fluid communication. Optionally, the system may also include a fan unit 94. However, the optional fan unit is preferably not in fluid communication with the other components.

Reservoir tank 37 holds the primary volume of coolant fluid and provides surface area to conduct heat away from the fluid while it is contained in the tank 37. The tank has at least 2 openings, an exit port 13 and a return port 14. Optionally, the reservoir tank includes a ventilation port 66. Pump 47 causes the coolant fluid to move through the system 22. As may be appreciated by those skilled in the art, pump 47 may be located at a number of locations along the coolant fluid pathway with suitable results. However, in order to minimize curvature of plates 44 and 128, it is preferable to position pump 47 after the cooling chamber 4 so that the pump actually pulls liquid coolant from the bottom to the top of cooling chamber 4. If the pump is so positioned, as shown in FIG. 4, engaging the pump creates an area of low pressure at the top of the cooling chamber 4. In this way fluid flows through the cooing chamber 4 according to the arrows. Due to the "slipperiness" of some coolant fluids, pump 47 is preferably a positive displacement pump.

In order to regulate the flow of coolant fluid through the cooling chamber, a bypass line with a valve 634 may be provided. The bypass line provides a bypass route for coolant fluid to bypass the cooling chamber 4. The valve 634 is adapted to facilitate control over the amount of coolant fluid diverted through the bypass line. The bypass line and valve 634 allow a predetermined portion of coolant fluid to be diverted away from the flow directed to the cooling chamber 4 and thereby facilitate control over the flow rate through the cooling chamber itself. In this way, the flow rate through the cooling chamber may be regulated.

As one skilled in the art will appreciate, other methods and devices may also be used to regulate the flow through the cooling chamber. For example, the size and pump speed of pump 47 may be optimized for a given application. Alternatively, a variable speed pump may also be used. Preferably, the variable speed pump may be in electrical communication with at least one pressure transducer (not shown). Preferably, a pressure transducer may be placed upstream of the cooling chamber 4 and another pressure transducer may be placed downstream of the cooling chamber 4. The pressure information provided by the at least one pressure transducer may be utilized to set the operating speed of the variable speed pump. In that way, the flow rate through the cooling chamber 4 may be adjusted to maintain appropriate pressures in the device. Maintaining appropriate pressures in the cooling chamber 4 is important for preventing deformation or breakage of the display glass.

An optional filter 83 may be added to remove contamination in the fluid. Preferably, a radiator 72 and fan unit 94 may also be included to provide even greater thermal stability. Optionally, a spigot (not shown) may be provided to facilitate the process of filling and emptying the coolant fluid from the system.

As shown in FIG. 4 and optional radiator 72 is positioned to receive fluid exiting the cooling chamber 4. The radiator helps to further dissipate heat in the coolant fluid which has traveled across display surface 128. An optional fan unit 94 may be positioned to work in conjunction with the radiator 72.

In operation, fluid exits the reservoir tank 37 from an output port 13 which may be located beneath the tank 37. On its way to the cooling chamber 4, the fluid passes through optional filter 83. From the filter 83, the fluid next enters the cooling chamber 4 through inlet 98 of manifold 59. The fluid coolant travels up through the fluid compartment of the cooling chamber 4 in the direction indicated (dash arrows). The coolant fluid exits cooling chamber 4 through outlet 99 of the upper manifold 60. Preferably, the fluid is then received by an optional radiator 72. While traveling through the optional radiator 72, an optional fan unit 94 may force air past the radiator 72 to assist in transferring heat away from the coolant fluid. Fan unit 94 also helps to exchange the heated air inside the display housing 75 with the ambient air outside the display housing 75. Pump 47, which may be positioned after the radiator 72 in FIG. 4, can pull the fluid toward the reservoir tank. The fluid is received into the reservoir tank 37 through return port 14. Preferably, return port 14 may be disposed at a location that is relatively distant from exit port 13 so as to allow the returning fluid the maximum opportunity to cool before it exits the reservoir tank 37 through port 13.

If desired, fan units may be located at the base of the housing 75 just behind the cooling chamber 4 of display 15. Fan units may provide a laminar flow of air through the interior of the housing 75. Preferably, the airflow will be directed across at least one external surface of reservoir tank 37. As described in co-pending U.S. application Ser. No. 11/941,728, which is incorporated by reference, the air exhaust flow may ultimately be redirected onto the cooling chamber surface 44 by way of an optional air curtain system 114 (see FIGS. 1 and 4).

If desired, a temperature sensor (not shown) and a switch (not shown) may be incorporated within the electronic display 15. The temperature sensor may be used to detect when temperatures have reached a predetermined threshold value. In such a case, the pump can be selectively engaged when the temperature in the display meets a predetermined value. Predetermined thresholds may be selected and the system may be configured with a thermostat (not shown) to advantageously keep the display at a relatively constant temperature, or at least within a range of acceptable temperatures. Alternatively, to avoid the need for a thermostat, the pump 47 may run continuously when the electronic display 15 is operational.

Figure 5:
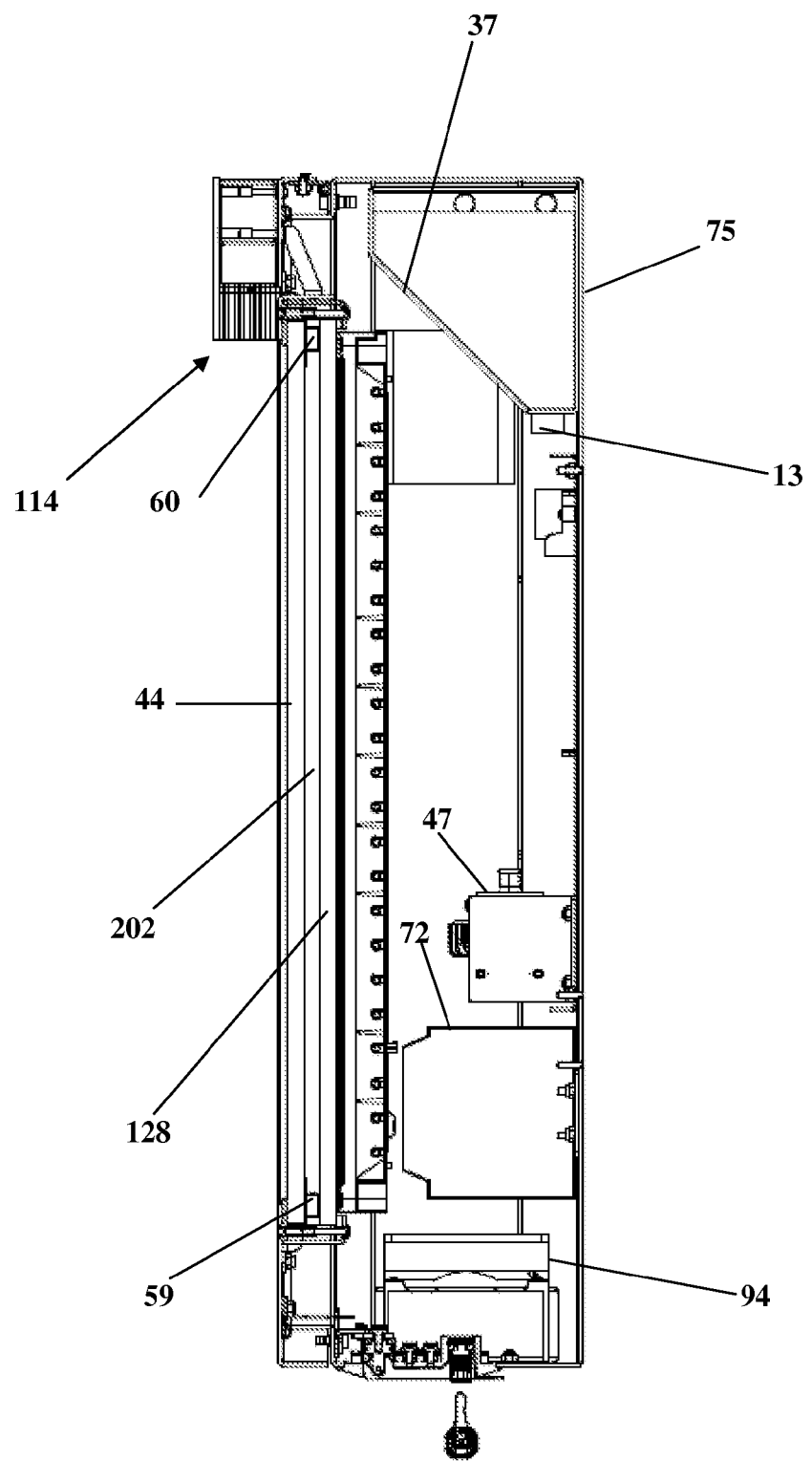
FIG. 5 is a cross-sectional side view through the center of the display.

FIG. 5 is a side cross-sectional view of an exemplary embodiment showing the preferred location of certain components. Advantageously, the reservoir tank 37, the pump 47, the cooling chamber 4, the radiator 72, the fan unit 94, a filter (not shown), may all be mounted within housing 75. In the figure, the interconnecting tubing is hidden for clarity.

Preferably, reservoir tank 37 may be located near the top corner of the housing 75 of the display 15. The tank 37 may also have a triangular shape. This will allow the upper and posterior surfaces of the tank to conform to the housing of the tank. This position facilitates efficient heat transfer of the heat in the coolant fluid to the external surfaces of the display housing 75. Although this arrangement provides acceptable results, many other arrangements would also provide suitable cooling.

In the arrangement shown in FIG. 5, fan unit 94 forces a laminar flow of air into the display housing 75. In the embodiment shown, the air will travel upward toward reservoir tank 37. Because tank 37 extends across the top of the housing and it has a triangular shape, the tank 37 will cause the moving air to exit toward the front of the display. An optional air curtain device 114 may be included to direct the exhaust air across the front glass 44 of the cooling chamber. The stream of air will also assist in the removal of heat from the electronic display surface 128.

Having shown and described a preferred embodiment of the invention, those skilled in the art will realize that many variations and modifications may be made to affect the described invention and still be within the scope of the claimed invention. For example, the order of many of the components mentioned in FIG. 4 is not critical and may be switched without substantially sacrificing the devices performance. Additionally, many of the elements indicated above may be altered or replaced by different elements which will provide the same result and fall within the spirit of the claimed invention. It is the intention, therefore, to limit the invention only as indicated by the scope of the claims.

I claim:

1. A liquid coolant system for a flat panel electronic display with a front display surface, the system comprising:
    a transparent liquid cooling chamber anterior to said front display surface, the chamber comprising
        the front display surface;
        a front glass mounted in front of and substantially parallel to the front display surface;
        two or more spacing members placed opposite one another and extending along the edges of the front display surface and front glass;
        an entrance manifold to allow coolant to enter the chamber; and
        an exhaust manifold to allow fluid to exit the chamber;
    a reservoir tank in fluid communication with said transparent liquid cooling chamber; and
    a pump in fluid communication with said transparent liquid cooling chamber and said reservoir tank.

2. The system of claim 1, wherein the cooling chamber defines a fluid compartment that is anterior to and at least coextensive with the viewable area of the front electronic display surface.

3. The system of claim 2, wherein essentially all viewable light emitted by the display must travel through the fluid compartment to be seen by an observer.

4. The system of claim 2, wherein coolant fluid in the fluid compartment contacts the front display surface.

5. The system of claim 1, wherein:
    the entrance manifold extends along the bottom of the cooling chamber;
    the exhaust manifold extends along the top of the cooling chamber;
    wherein the arrangement of the manifolds causes essentially uniform flow of coolant fluid across the cooling chamber.

6. The system of claim 1, wherein the pump is adapted to run continuously when the electronic display is operating.

7. The system of claim 1, further comprising a bypass line with a control valve in fluid communication between said reservoir and said pump.

8. The system of claim 1, wherein:
    the reservoir tank includes an exit port and a return port;
        wherein the exit port provides an exit for fluid leaving the reservoir tank;
        wherein the return port receives coolant that moved through the cooling chamber; and
        wherein the exit port is spaced apart from the return port so that coolant is permitted to mix as it travels from the return port to the exit port.

9. The system of claim 8, wherein:
    the coolant fluid entering the reservoir tank is warmer than the fluid exiting the tank.

10. The system of claim 8, wherein:
    the reservoir tank includes a ventilation port.

11. The system of claim 1, further comprising:
    a filter in fluid communication with the cooling chamber.

12. The system of claim 1, further comprising:
    a housing which contains the transparent liquid cooling chamber, reservoir tank, and pump; and
    a fan positioned to draw air into the housing.

13. The system of claim 12, further comprising:
    a radiator in fluid communication with the cooling chamber
    wherein said fan forces air over said radiator.

14. The system of claim 13, further comprising:
    an air curtain device which directs exhaust air across the front glass.

15. The system of claim 1 further comprising:
    a housing for the electronic display;
    a reflection shield attached to the housing;
    wherein the housing of the electronic display contains the transparent liquid cooling chamber, the pump, and the reservoir tank.

16. A liquid coolant system for a flat panel electronic display with a front display surface, the system comprising:
    a transparent liquid cooling chamber anterior to said front display surface comprising:
        a front glass mounted anterior to the front display surface;

two or more spacing members placed opposite one another and extending along the edges of the front display surface and front glass;

an entrance manifold to allow coolant to enter the chamber; and an exhaust manifold to allow fluid to exit the chamber;

a pump in fluid communication with said cooling chamber and adapted to pull cooling liquid from the exhaust manifold of said cooling chamber;

a reservoir tank with a coolant liquid in fluid communication with said pump; and a filter in liquid communication with said reservoir tank; and a fan adapted to force air over the reservoir tank.

17. The system of claim 16 further comprising a radiator in liquid communication with said cooling chamber and wherein said fan forces air over the radiator.

18. A method for cooling a flat panel electronic display with a front display surface, the method comprising:

providing an interconnected cooling device comprising a reservoir tank, a pump, and a cooling chamber comprising the front display surface;

a front glass mounted in front of and substantially parallel to the front display surface;

two or more spacing members placed opposite one another and extending along the edges of the front display surface and front glass;

an entrance manifold to allow coolant to enter the chamber; and an exhaust manifold to allow fluid to exit the chamber;

placing a predetermined amount of transparent liquid coolant into the interconnected cooling device;

forcing the liquid coolant through the interconnected cooling device;

transferring heat from the front display surface to the liquid coolant within the cooling chamber; and cooling the liquid coolant.

19. The method of claim 18, further comprising the step of:

filtering the liquid coolant to remove contaminants.

20. The method of claim 18, further comprising the steps of:

providing a radiator in liquid communication with said interconnected cooling device; and wherein said cooling step comprises forcing air over said radiator.

21. The method of claim 18, further comprising the steps of:

providing a housing which contains the reservoir tank, pump, and cooling chamber; and forcing air through the housing.

22. The method of claim 21, further comprising the steps of:

filtering the liquid coolant to remove contaminants.

23. The method of claim 22, further comprising the steps of:

redirecting exhaust air along the front glass.

* * * * *